(12) United States Patent
Hirata et al.

(10) Patent No.: US 7,679,467 B2
(45) Date of Patent: Mar. 16, 2010

(54) VOLTAGE CONTROLLED OSCILLATOR

(75) Inventors: Manabu Hirata, Kanagawa (JP); Yoichi Fueki, Kanagawa (JP); Kazuyuki Tajima, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 11/346,296

(22) Filed: Feb. 3, 2006

(65) Prior Publication Data
US 2006/0197610 A1    Sep. 7, 2006

(30) Foreign Application Priority Data
Mar. 2, 2005    (JP)    ............................ 2005-057104

(51) Int. Cl.
*H03K 3/03*    (2006.01)
(52) U.S. Cl. ..................... 331/185; 331/34; 331/57
(58) Field of Classification Search .................... 331/57, 331/34, 185; 327/109, 543
See application file for complete search history.

(56) References Cited

U.S. PATENT DOCUMENTS

| | | | | |
|---|---|---|---|---|
| 5,412,349 | A * | 5/1995 | Young et al. | 331/34 |
| 6,275,116 | B1 * | 8/2001 | Abugharbieh et al. | 331/34 |
| 6,396,357 | B1 * | 5/2002 | Sun et al. | 331/57 |

FOREIGN PATENT DOCUMENTS

| | | |
|---|---|---|
| JP | 62-290208 | 12/1987 |
| JP | 64-077222 | 3/1989 |
| JP | 09-018253 | 1/1997 |
| JP | 2002-223149 | 8/2002 |
| JP | 2003-198333 | 7/2003 |
| JP | 2003-229764 | 8/2003 |

OTHER PUBLICATIONS

Office Action dated Apr. 10, 2007 issued by the Japanese Patent Office in corresponding application No. 2005-057104.
Japanese Office Action for Application No. JP2005-057104 dated Nov. 12, 2007.

\* cited by examiner

*Primary Examiner*—Joseph Chang
(74) *Attorney, Agent, or Firm*—Studebaker & Brackett PC; Donald R. Studebaker

(57) ABSTRACT

A voltage controlled oscillator which performs an oscillating operation at a frequency corresponding to a control voltage, includes a voltage-current converter circuit which converts the control voltage to a control current corresponding to a voltage value thereof, and a ring oscillator through which an operating current corresponding to the control current generated by the voltage-current converter circuit is caused to flow, and which oscillates at a frequency corresponding to a current value thereof. The voltage-current converter circuit has a voltage-voltage converting circuit which inputs the control voltage therein and converts the same to a control current corresponding to the voltage value thereof, and an offset current generating circuit which adds a constant current to the control current.

4 Claims, 3 Drawing Sheets

VOLTAGE CONTROLLED OSCILLATOR

BACKGROUND OF THE INVENTION

The present invention relates to a voltage controlled oscillator (VCO), and a startup circuit suitable for the voltage controlled oscillator.

A voltage controlled oscillator is used in a PLL (Phase-Locked Loop) circuit or the like. As the voltage controlled oscillator of the PLL circuit, may be mentioned, for example, a ring oscillator comprised of inverters, a differential ring oscillator, etc. Any of such voltage controlled oscillators changes an amount of current supplied to each of inverter circuits or differential circuits used as components of the ring oscillator in accordance with a control voltage to change a delay time of each inverter, thereby changing an oscillation frequency. Thus, the voltage controlled oscillator is provided with a voltage-current converter circuit for converting a control voltage to a control current in addition to an oscillator.

In the voltage-current converter circuit of the conventional voltage controlled oscillator, the control current reaches approximately zero in a region in which the control voltage is low. Thus, the voltage controlled oscillator had the property that it did not oscillate in such a region or became unstable in oscillation.

And the PLL circuit provided with such a voltage controlled oscillator was accompanied by the problem that when an input clock was interrupted due to some reasons, the PLL circuit attempted to lock onto a signal having a low frequency to thereby reduce the control voltage and eventually led to an output stop.

There was also a fear that when the control voltage was low upon power-on or the like, for example, the PLL circuit could not be locked, so that a clock signal outputted from the PLL circuit became unstable.

Therefore, there is proposed such a semiconductor integrated circuit as shown in a patent document 1 (Japanese Patent Application Laid-Open No. 2002-223149) as a PLL circuit oscillatable even when the input of the reference clock is interrupted or it is placed in the region in which the control voltage is low upon power-on or the like.

In this type of semiconductor integrated circuit, a voltage controlled oscillator has a voltage-current converter circuit which converts a control voltage to a control current corresponding to its voltage value, and an oscillator circuit through which an operating current corresponding to the control current generated by the voltage-current converter circuit is caused to flow and which oscillates at a frequency corresponding to its current value. The voltage-current converter circuit is provided with an auxiliary current adding means which is provided in parallel with a MOS (Metal Oxide Semiconductor) transistor whose gate is inputted with the control voltage and which auxiliarly adds a current to a control current based on the control voltage.

In the patent document 1, the auxiliary current is generated at a circuit in which diode-connected MOS transistors are cascade-connected in two stages. Alternatively, the auxiliary current is generated at a circuit in which a resistor and a diode-connected MOS transistor are cascade-connected. Therefore, the value of the auxiliary current changes depending upon a power supply voltage in terms of a circuit configuration. That is, the auxiliary current increases in proportion to the power supply voltage. Since the auxiliary current is simply determined based on a voltage between the power supply and ground, a problem arises in that it is sensitive even to power noise and ground noise.

SUMMARY OF THE INVENTION

With the foregoing in view, it is therefore an object of the present invention to provide a voltage controlled oscillator capable of solving the drawbacks of such a prior art and causing an auxiliary current set as designed to flow without depending upon a power supply voltage.

According to one aspect of the present invention, for attaining the above object, there is provided a voltage controlled oscillator which performs an oscillating operation at a frequency corresponding to a control voltage, comprising a voltage-current converter circuit which converts the control voltage to a control current corresponding to a voltage value thereof; and an oscillator circuit through which an operating current corresponding to the control current generated by the voltage-current converter circuit is caused to flow, and which oscillates at a frequency corresponding to a current value thereof, wherein the voltage-current converter circuit has a semiconductor circuit which inputs the control voltage therein and converts the same to a control current corresponding to the voltage value thereof, and a constant current adding circuit which adds a constant current to the control current.

Since a constant current source controllable to a design value is used as a reference current, the voltage controlled oscillator of the present invention is capable of causing an auxiliary current set as designed to flow without depending upon a power supply voltage. Thus, a control voltage-oscillation frequency characteristic of the voltage controlled oscillator does not change depending upon the power supply voltage. By doing so, the control voltage-oscillation frequency characteristic can also be controlled as designed. Even as to noise, the voltage controlled oscillator has resistance to noise and is insusceptible to noise because of the constant current source.

According to the present invention, it is possible to allow an auxiliary current to flow without depending upon the control voltage and cause the voltage controlled oscillator to reliably oscillate in an in-design operating region even when the element or circuit for converting the control voltage to the control current is in a non-operating state.

In the voltage controlled oscillator of the present invention, preferably, the oscillator circuit is a ring oscillator in which a plurality of logic gates are connected in tandem and the output of the final stage thereof is fed back to the input of the first stage thereof, and the operating current is a current which is caused to flow through each of the logic gates.

Further, in the voltage controlled oscillator, the voltage-current converter circuit may be a MOS transistor which causes the control current to flow through a drain thereof, a current control MOS transistor current mirror-connected to the MOS transistor may be connected to the corresponding logic gate, and the MOS transistor may allow an operating current corresponding to the control current to flow into each of the logic gates.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A preferred embodiment of a voltage controlled oscillator according to the present invention will next be described in detail with reference to the accompanying drawings. Prior to the description of the embodiment according to the present invention, a voltage controlled oscillator having the following voltage-current converter circuit will be explained as a comparative example. That is, the voltage-current converter circuit showing the comparative example has a semiconductor circuit to which a control voltage is inputted and which converts the control voltage to a control current corresponding to a voltage value thereof, but does not include a constant current adding circuit of the present invention, which adds a constant current to the control current. This voltage controlled oscillator will be explained with reference to FIGS. 3 and 4.

Figure 3:
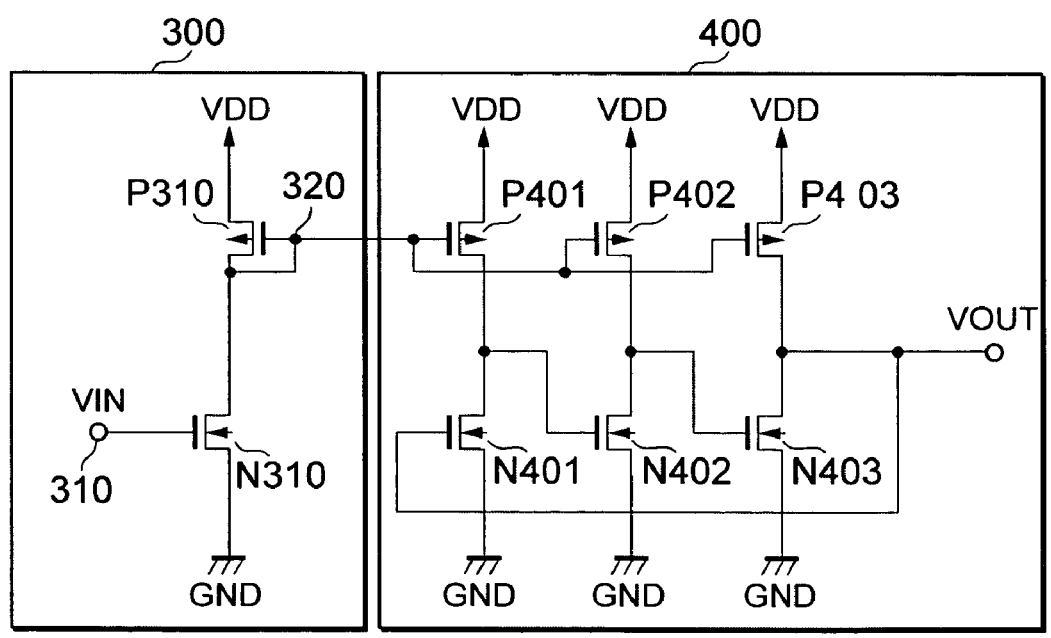
FIG. 3 is a circuit diagram of a voltage controlled oscillator according to a comparative example.

FIG. 3 shows a configuration of the voltage controlled oscillator according to the comparative example. The voltage controlled oscillator has a voltage-voltage converting circuit 300 including a voltage-current converter circuit which converts a control voltage to a control current corresponding to a voltage value thereof, and a ring oscillator 400 which inputs an output voltage of the voltage-voltage converting circuit 300 therein as a bias voltage and generates oscillations. The ring oscillator 400 is of an oscillator circuit through which an operating current corresponding to the control current generated by the voltage-current converter circuit is caused to flow thereby to generate oscillations at a frequency corresponding to a current value.

The voltage-voltage converting circuit 300 will first be explained. The voltage-voltage converting circuit 300 converts a control voltage into a control current therein and further converts it to a control voltage. That is, a common-source NMOS transistor N310 of which the gate is connected to a control input terminal 310, converts a control voltage to a control current. Next, a diode-connected PMOS transistor P310 connected to the common-source NMOS transistor N310 converts the control current to a control voltage again and outputs it to the ring oscillator 400. The voltage-voltage converting circuit 300 can also be represented as a voltage-current converter circuit according to where a cut area in the circuit 300 should be selected. In the way of dividing the circuit shown in the present figure, however, the voltage-voltage converting circuit is configured as a voltage-voltage converting circuit.

A configuration of the voltage-voltage converting circuit 300 will be described. The n-type MOS transistor N310 has a gate terminal connected to the control input terminal, a drain terminal connected to a drain terminal of the p-type MOS transistor P310 and a source terminal connected to a ground GND.

A gate terminal of the p-type MOS transistor P310 and its drain terminal are connected to a node 320, and a source terminal thereof is connected to a power supply VDD.

When a voltage greater than or equal to a gate threshold voltage of the n-type MOS transistor N310 is applied between the control input terminal 310 and the ground GND, the n-type MOS transistor N310 is brought into conduction. Thus, the input control voltage VIN is converted into a control current by the n-type MOS transistor N310, which in turn flows through the n-type MOS transistor N310.

The current that flows through the n-type MOS transistor N310 flows into the diode-connected p-type MOS transistor P310 where it is converted to a control voltage again, after which it is outputted as a control voltage through the node 320.

On the other hand, when the voltage greater than or equal to the gate threshold voltage of the n-type MOS transistor N310 is not applied between the control input terminal 310 and the ground GND, the n-type MOS transistor N310 is brought into a cutoff state, so that a bias voltage corresponding to the input control voltage VIN is not produced at the node 320.

Next, the ring oscillator 400 is of a circuit in which inverter circuits are connected in ring fashion in the form of odd-numbered stages. The circuit example of FIG. 3 shows a ring oscillator having a three-stage configuration. An output of the inverter circuit corresponding to the third stage is inputted to the inverter circuit corresponding to the first stage to thereby produce oscillations.

The first stage inverter circuit comprises a p-type MOS transistor P401 and an n-type MOS transistor N401. A source terminal of the p-type MOS transistor P401 is connected to the power supply VDD. A source terminal of the n-type MOS transistor N401 is connected to the ground GND. Drain terminals of the p-type MOS transistor P401 and the n-type MOS transistor N401 are interconnected with each other.

In a manner similar to above, the second stage inverter circuit also comprises a p-type MOS transistor P402 whose source terminal is connected to the power supply VDD, and an n-type MOS transistor N402 whose source terminal is connected to the ground GND. Drain terminals of the p-type MOS transistor P402 and the n-type MOS transistor N402 are interconnected with each other. Even in the third stage inverter circuit, a p-type MOS transistor P403 and an n-type MOS transistor N403 are connected to each other in like manner.

Gate terminals of the p-type MOS transistors P401, P402 and P403 of the respective stages are all connected to the node 320 and inputted with the same bias voltage (control voltage). A gate terminal of the first stage n-type MOS transistor N401 is connected to its corresponding drain terminal of the three stage n-type MOS transistor N403. A gate terminal of the second stage n-type MOS transistor N402 is connected to its corresponding drain terminal of the first stage n-type MOS transistor N401. A gate terminal of the three stage n-type MOS transistor N403 is connected to its corresponding drain terminal of the second stage n-type MOS transistor N402.

A constant current that flows through each of the p-type MOS transistors P401, P402 and P403 changes according to the voltage applied to the node 320. Thus, since currents that flow through the n-type MOS transistors N401, N402 and N403 change and delay times of the respective stages of the inverter circuits change, an oscillation frequency changes.

Figure 4:
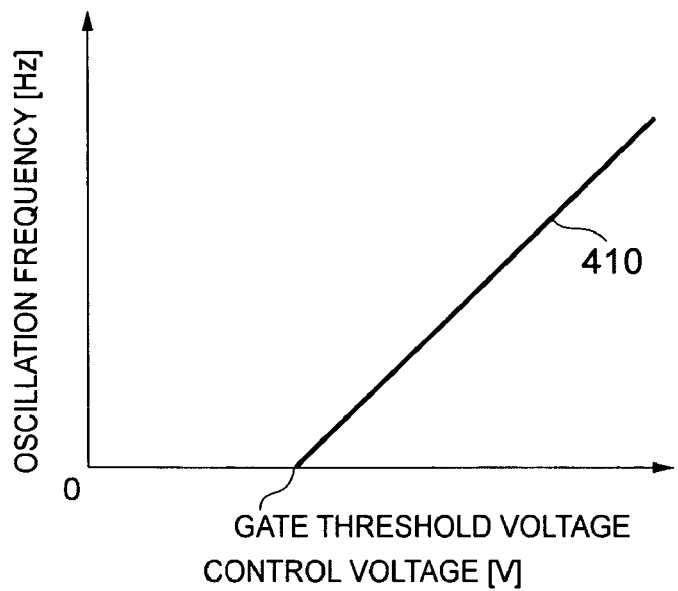
FIG. 4 is a graph showing the ideal characteristics of an oscillation frequency with respect to a control voltage in the voltage controlled oscillator according to the comparative example.

The p-type MOS transistor P310 of the voltage-voltage converting circuit 300, and the p-type MOS transistors P401, P402 and P403 of the ring oscillator 400 are connected in a current mirror configuration. The current that flows through each of the p-type MOS transistors P401, P402 and P403 changes in accordance with a current that flows through the p-type MOS transistor P310. Thus, only when the voltage greater than or equal to the gate threshold voltage of the n-type MOS transistor N310 is applied between the control input terminal 310 and the ground GND, the oscillation frequency of the ring oscillator 400 changes in accordance with the input control voltage VIN applied to the control input terminal 310 in the circuit shown in FIG. 3. FIG. 4 shows an ideal characteristic 410 of an oscillation frequency with respect to an input control voltage applied to the circuit of the comparative example.

In the voltage controlled oscillator configured like the comparative example, however, when the voltage greater than or equal to the gate threshold voltage of the n-type MOS transistor is not applied between the control input terminal 310 and the ground GND, a bias current having a value set by design does not flow through the ring oscillator 400. Therefore, a problem arises in that the whole PLL circuit including the voltage controlled oscillator is fixed to an operating region out of design due to a current (leak current or the like of MOS transistor) which is not taken in consideration in terms of design, so that it cannot be restored to an in-design operating region.

Figure 1:
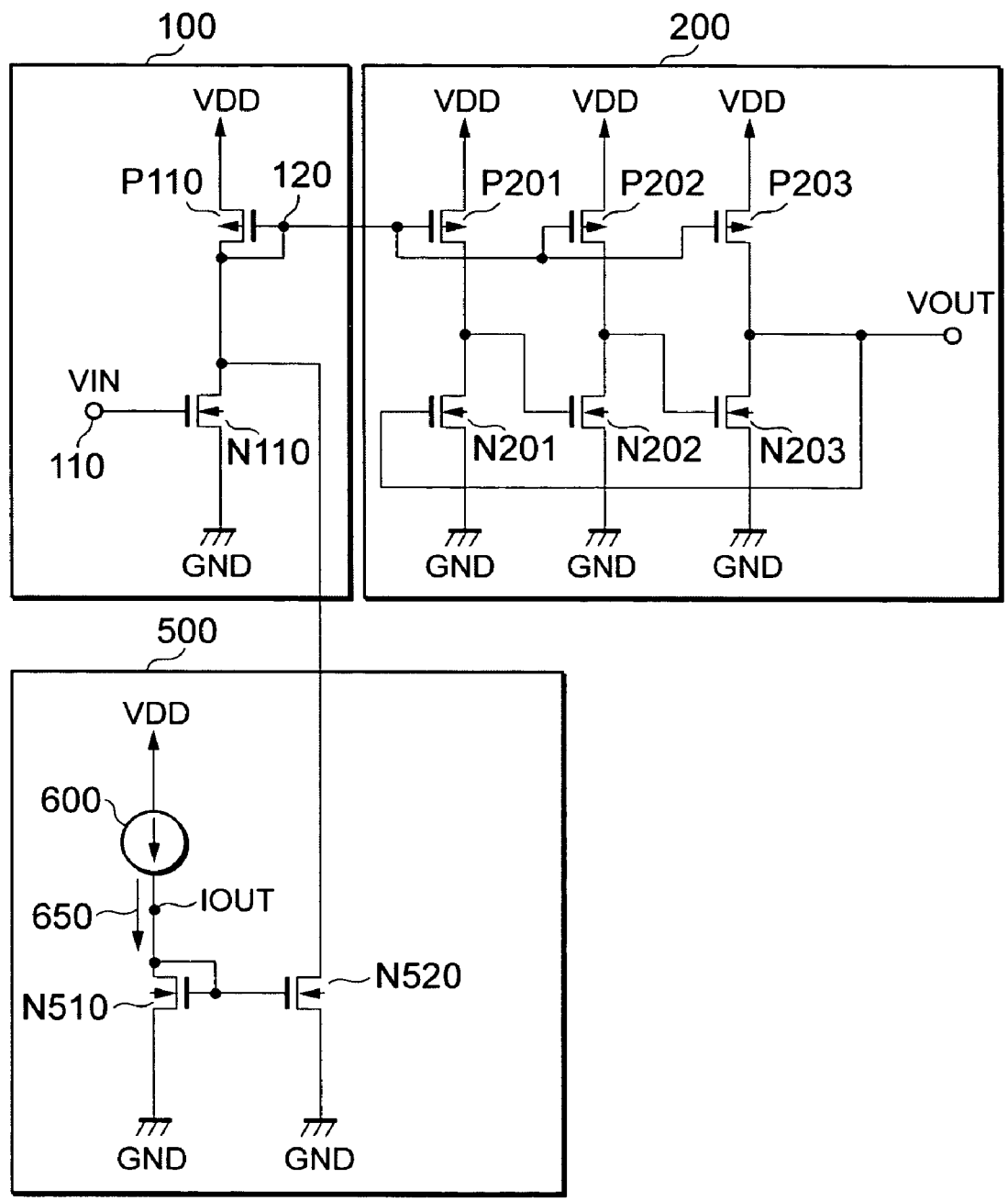
FIG. 1 is a circuit diagram of one embodiment of a voltage controlled oscillator according to the present invention.

The embodiment showing the voltage controlled oscillator of the present invention that solves the above problem will next be explained. A circuit diagram of the embodiment of the present invention is shown in FIG. 1. The present voltage controlled oscillator comprises a voltage-voltage converting circuit 100 and a ring oscillator 200. An offset current generating circuit 500 corresponding to a constant current adding circuit that adds a constant current to a control current is added to the voltage-voltage converting circuit 100.

The offset current generating circuit 500 comprises a current mirror circuit which consists of n-type MS transistors N510 and N520, and a constant current source 600 which supplies a constant current 650. A gate terminal and a drain terminal of the n-type MOS transistor N510 are connected to a minus terminal of the constant current source 600 and a gate terminal of the n-type MOS transistor N520. A source terminal of the n-type MOS transistor N510 is connected to a ground GND. A plus terminal of the constant current source 600 is connected to a power supply VDD. A drain terminal of the n-type MOS transistor N520 is connected to a node 120.

The voltage-voltage converting circuit 100 and the ring oscillator 200 are respectively identical to the voltage-voltage converting circuit 300 and ring oscillator 400 in the circuit according to the comparative example. The n-type MOS transistor N520 of the offset current generating circuit 500 is connected in parallel with an n-type MOS transistor N110 of the voltage-voltage converting circuit 100. The n-type MOS transistor N110 converts an input control voltage to a control current as already mentioned.

The voltage-voltage converting circuit 100 includes the n-type MOS transistor N110 and a p-type MOS transistor P110. A gate terminal of the n-type MOS transistor N110 is connected to a control input terminal 110, and a drain terminal thereof is connected to a drain terminal of the p-type MOS transistor P110. A source terminal of the n-type MOS transistor N110 is connected to the ground GND. A gate terminal and a drain terminal of the p-type MOS transistor P110 are connected to the node 120, and a source terminal thereof is connected to the power supply VDD.

Next, the ring oscillator 200 is of a circuit in which inverter circuits are connected in ring fashion in the form of odd-numbered stages. The circuit example of FIG. 3 shows a ring oscillator having a three-stage configuration. An output of the inverter circuit corresponding to the third stage is inputted to the inverter circuit corresponding to the first stage to thereby generate oscillations.

The first stage inverter circuit comprises a p-type. MOS transistor P201 and an n-type MOS transistor N201. A source terminal of the p-type MOS transistor P201 is connected to the power supply VDD. A source terminal of the n-type MOS transistor N201 is connected to the ground GND. Drain terminals of the p-type MOS transistor P201 and the n-type MOS transistor N201 are interconnected with each other.

In a manner similar to above, the second stage inverter circuit also comprises a p-type MOS transistor P202 whose source terminal is connected to the power supply VDD, and an n-type MOS transistor N202 whose source terminal is connected to the ground GND. Drain terminals of the p-type MOS transistor P202 and the n-type MOS transistor N202 are interconnected with each other. Even in the third stage inverter circuit, a p-type MOS transistor P203 and an n-type MOS transistor N203 are connected to each other in like manner.

Gate terminals of the p-type MOS transistors P201, P202 and P203 of the respective stages are all connected to the node 120 and inputted with the same bias voltage (control voltage). A gate terminal of the first stage n-type MOS transistor N201 is connected to its corresponding drain terminal of the three stage n-type MOS transistor N203. A gate terminal of the second stage n-type MOS transistor N202 is connected to its corresponding drain terminal of the first stage n-type MOS transistor N201. A gate terminal of the three stage n-type MOS transistor N203 is connected to its corresponding drain terminal of the second stage n-type MOS transistor N202.

Figure 2:
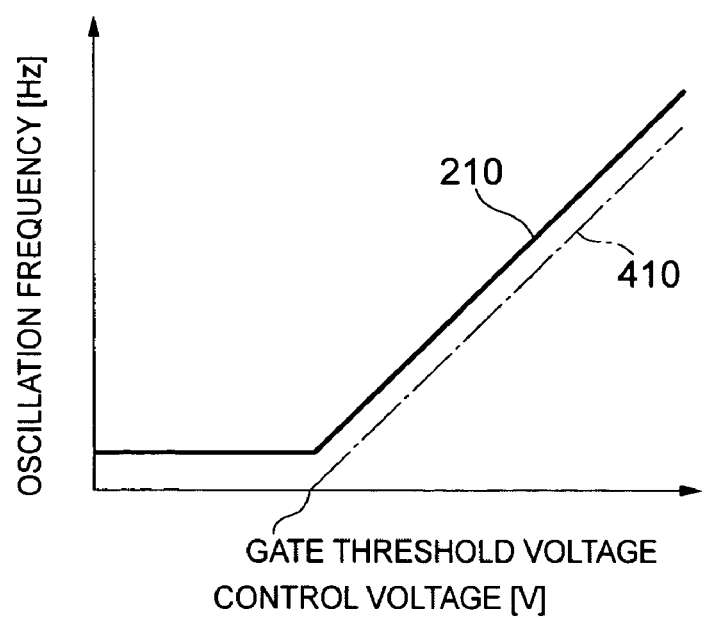
FIG. 2 is a graph showing the characteristics of an oscillation frequency with respect to a control voltage in the one embodiment of the voltage controlled oscillator according to the preset invention.

The operation of the present embodiment will be explained using FIGS. 1 and 2. FIG. 2 shows the manner in which a characteristic 210 of an oscillation frequency with respect to an input control voltage applied to the circuit according to the present embodiment is compared with the ideal characteristic 410 of the circuit according to the comparative example shown in FIG. 4. When the voltage greater than or equal to the gate threshold voltage of the n-type MOS transistor is applied between the control input terminal 110 and the ground GND in FIG. 1, the n-type MOS transistor N110 is brought to a cutoff state. Thus, the n-type MOS transistor N110 does not perform a voltage-current converting operation. That is, the n-type MOS transistor N110 does not supply a bias current corresponding to a control voltage VIN to the p-type MOS transistor P110. Since, however, the bias current supplied from the constant current source 600 flows through the p-type MOS transistor P110 through the n-type MOS transistor N520 connected to the node 120, a bias voltage is generated at the node 120 by means of the constant current source 600. Therefore, the present circuit oscillates at a prescribed frequency even at not greater than the gate threshold voltage as indicated by such a solid line 210 as shown in FIG. 2.

When the voltage greater than or equal to the gate threshold voltage of the n-type MOS transistor is applied between the control input terminal 110 and the ground GND, the n-type MOS transistor N110 is brought into conduction to cause one obtained by adding the bias current corresponding to the control voltage VIN and the bias current supplied from the constant current source 600 to flow into the p-type MOS transistor P110. Thus, as shown in FIG. 2, the present circuit is brought to the characteristic 210 obtained by adding an offset frequency based on the bias current generated by the constant current source 600 to the ideal characteristic 410 of the circuit according to the comparative example.

Figure 5:
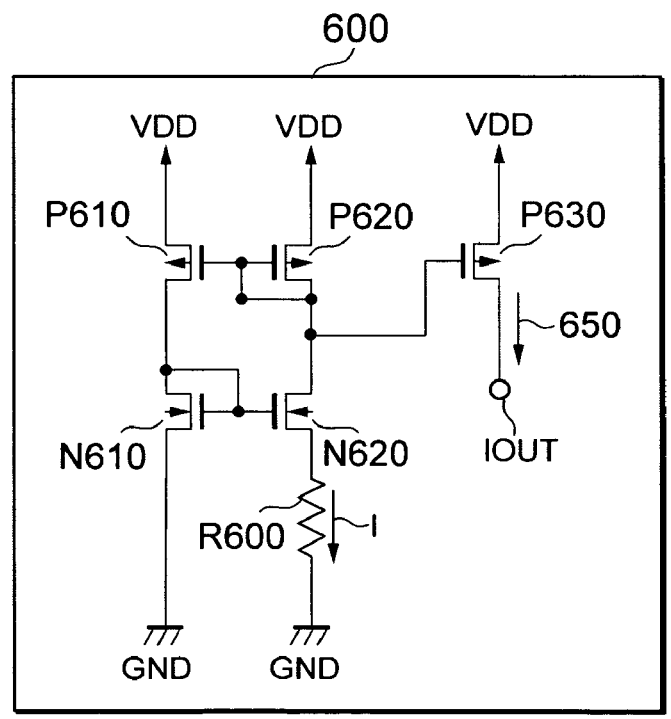
FIG. 5 is a circuit diagram of a constant current source employed in the voltage controlled oscillator according to the present invention.

One embodiment of the constant current source 600 will be explained using FIG. 5. In the constant current source 600, the source of a p-type MOS transistor P610 is connected to a power supply VDD, the gate thereof is connected to the gate of a p-type MOS transistor P620, and the drain thereof is connected to the drain of an n-type MOS transistor N610. The drain and gate of the n-type MOS transistor N610 are connected to the gate of an n-type MOS transistor N620. The source of the n-type MOS transistor N610 is connected to a ground GND.

The source of the p-type MOS transistor P620 is connected to the power supply VDD, and the gate and drain thereof are connected to the drain of the n-type MOS transistor N620 and connected to the gate of a p-type MOS transistor P630. The source of the n-type MOS transistor N620 is connected to the ground GND through a resistor R600.

The source of the p-type MOS transistor P630 is connected to the power supply VDD. The drain of the p-type MOS transistor P630 corresponds to the output of the constant current source 600 which supplies a constant current 650. The drain thereof is connected to the drain of the n-type MOS transistor N510 in the offset current generating circuit 500.

Since the p-type MOS transistors P610 and P620 take a current mirror configuration in the constant current source 600, an equal current I flows through the two with a channel width and a channel length being made identical in size. The current I is allowed to flow through the n-type MOS transistors N610 and N620 connected in a current mirror configuration in which a W/L (where W=channel width and L=channel length) ratio is K times. That is, when the value of W/L of the n-type MOS transistor N610 is set to 1, the value of W/L of the n-type MOS transistor N620 is assumed to be K.

The difference between a gate-to-source voltage of the n-type MOS transistor N610, which is produced by the W/L ratio corresponding to K times, and a gate-to-source voltage of the n-type MOS transistor N620 is applied across the resistor R600. That is, the current I is determined only by the difference between the gate-to-source voltage of the n-type MOS transistor N610 and the gate-to-source voltage of the n-type MOS transistor N620 and the resistance value of the resistor R600. An equation indicative of the magnitude of the current I is expressed as follows:

$$I=(2\beta)\times(1/R^2)\times(1-1/\sqrt{K})^2$$

$$\beta=(W/L)\times\mu\times Cox$$

where μ: carrier mobility, and
Cox: gate oxide film capacitance per unit area

As expressed in the above expression, the constant current source 600 is capable of generating a constant current independent on the power supply voltage. In the constant current source 600, the p-type MOS transistor P630 which shares the gate terminal with the p-type MOS transistor P620, is provided to configure the current mirror, and the constant current is supplied to the voltage controlled oscillator.

According to the present embodiment as described above, the offset current generating circuit 500 continues to cause the constant bias current to flow into the ring oscillator 200 even where the voltage greater than or equal to the gate threshold voltage of the n-type MOS transistor is not applied between the control input terminal 110 and the ground GND. It is therefore possible to avoid the problem that the whole PLL circuit including the voltage controlled oscillator is brought into the operating region out of design due to the current (leak current or the like of MOS transistor) which is not taken in consideration in terms of design, whereby it cannot be restored to the in-design operating region.

Since the design-controlled current source is set as a reference current because the constant current source is used in the present invention, a current having a value set as designed can be supplied-without depending upon a power supply voltage. Thus, an advantageous effect is brought about in that the control voltage-oscillation frequency characteristic of the voltage controlled oscillator does not change depending upon the power supply voltage. By doing so, the control voltage-oscillation frequency characteristic can also be controlled as designed. Since the constant current source is used even as to noise, the present embodiment has resistance to noise and is insusceptible to noise.

Incidentally, although the above embodiment has explained, as an example, the voltage controlled oscillator in which the oscillator circuit is realized by the ring oscillator, the present invention can be adapted even to other oscillator circuits if a voltage controlled oscillator having such a configuration that the control voltage VIN is converted to its corresponding control current even in a path through which the control voltage VIN is transferred to the oscillator circuit, is taken. Although the present embodiment has explained the three-stage ring oscillator as an example, the present invention can be applied even to a ring oscillator having stages other than the three stages.

While the preferred form of the present invention has been described, it is to be understood that modifications will be apparent to those skilled in the art without departing from the spirit of the invention. The scope of the invention is to be determined solely by the following claims.

What is claimed is:

1. A voltage controlled oscillator which performs an oscillating operation at a frequency corresponding to a control voltage, comprising:
    a voltage-current converter circuit which converts the control voltage to a control current corresponding to a voltage value thereof;
    an oscillator circuit, having a plurality of logic gates, through which an operating current corresponding to the control current generated by the voltage-current converter circuit is caused to flow, and which oscillates at a frequency corresponding to a current value thereof; and
    a constant current adding circuit configured to add a constant bias current to the control current, wherein the constant current adding circuit is further configured to continuously provide the constant bias current to the control current so as to maintain the oscillating operation of the oscillator when the control voltage is below a threshold voltage;
    wherein the voltage-current converter circuit is a MOS transistor which, when receives the control voltage greater than or equal to the threshold voltage, causes the control current to flow through a drain thereof, the MOS transistor is current mirror connected to one of plurality of logic gates, and
    wherein the constant current adding circuit includes a current-control MOS transistor that is directly connected to the MOS transistor of the voltage-current converter circuit and directly to the oscillator circuit, and the MOS transistor of the voltage-current converter circuit effects an operating current corresponding to the control current to flow into each of the logic gates.

2. The voltage controlled oscillator according to claim 1, wherein the oscillator circuit is a ring oscillator in which a plurality of logic gates are connected in tandem and the output of the final stage thereof is fed back to the input of the first stage thereof, and the operating current is a current which is caused to flow through each of the logic gates.

3. A voltage controlled oscillator, comprising:
    an input terminal which is applied with a control voltage;

a voltage-voltage converter circuit which includes a voltage-current converter and a current-voltage converter, wherein the voltage-current converter converts the control voltage to a control current and the current-voltage converter converts the control current to a bias voltage;

an oscillator circuit which oscillates at a frequency corresponding to the bias voltage; and an offset current adding circuit which adds a set current to the control current:

wherein the voltage-voltage converter includes a first MOS transistor and a second MOS transistor, the first MOS transistor includes a control electrode connected to the input terminal, a first electrode connected to a first voltage and a second electrode, the second MOS transistor includes a first electrode connected to a second voltage, a second electrode connected to the second electrode of the first MOS transistor and a control gate directly connected to the oscillator circuit and the second electrode of the second MOS transistor, and wherein the offset current adding circuit directly provides the offset current to the control gate of the second MOS transistor and directly to the oscillator circuit.

4. The voltage controlled oscillator according to claim 3, wherein the offset current adding circuit includes a constant current source which outputs a constant current, and wherein the control current corresponds to the constant current.

* * * * *